(12) United States Patent
Verghese et al.

(10) Patent No.: US 7,799,135 B2
(45) Date of Patent: Sep. 21, 2010

(54) REACTOR SURFACE PASSIVATION THROUGH CHEMICAL DEACTIVATION

(75) Inventors: Mohith Verghese, Phoenix, AZ (US); Eric J. Shero, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 11/539,312

(22) Filed: Oct. 6, 2006

(65) Prior Publication Data

US 2007/0084404 A1    Apr. 19, 2007

Related U.S. Application Data

(62) Division of application No. 10/841,585, filed on May 7, 2004, now Pat. No. 7,118,779.

(60) Provisional application No. 60/469,181, filed on May 9, 2003.

(51) Int. Cl.
*C23C 16/00* (2006.01)

(52) U.S. Cl. ..................................... 118/715

(58) Field of Classification Search .................. 118/715
See application file for complete search history.

(56) References Cited

U.S. PATENT DOCUMENTS

| | | | |
|---|---|---|---|
| 4,539,061 A | | 9/1985 | Sagiv |
| 4,756,971 A | * | 7/1988 | Virtanen et al. ............. 428/405 |
| 5,350,480 A | * | 9/1994 | Gray ...................... 156/345.26 |
| 5,479,727 A | * | 1/1996 | Fine et al. ...................... 34/516 |
| 5,591,494 A | | 1/1997 | Sato et al. |
| 5,647,953 A | | 7/1997 | Williams et al. |
| 5,728,629 A | | 3/1998 | Mizuno et al. |

(Continued)

FOREIGN PATENT DOCUMENTS

EP    0 844 028    5/1998

(Continued)

OTHER PUBLICATIONS

A. Schmohl, A. Khan and P. Hess, *Functionalization of oxidized silicon surfaces with methyl groups and their characterization*, Superlattices and Microstructures, Sep. 15, 2004, Superlattices and Microstructures 36 (2004), pp. 113-121, Elsevier Ltd.

(Continued)

*Primary Examiner*—Michael Cleveland
*Assistant Examiner*—Keath T Chen
(74) *Attorney, Agent, or Firm*—Knobbe Martens Olson & Bear LLP

(57) ABSTRACT

Protective layers are formed on a surface of an atomic layer deposition (ALD) or chemical vapor deposition (CVD) reactor. Parts defining a reaction space for an ALD or CVD reactor can be treated, in situ or ex situ, with chemicals that deactivate reactive sites on the reaction space surface(s). A pre-treatment step can maximize the available reactive sites prior to the treatment step. With reactive sites deactivated by adsorbed treatment reactant, during subsequent processing the reactant gases have reduced reactivity or deposition upon these treated surfaces. Accordingly, purge steps can be greatly shortened and a greater number of runs can be conducted between cleaning steps to remove built-up deposition on the reactor walls.

21 Claims, 7 Drawing Sheets

U.S. PATENT DOCUMENTS

| | | | |
|---|---|---|---|
| 6,071,573 | A | 6/2000 | Koemtzopoulos et al. |
| 6,162,499 | A | 12/2000 | Sandhu et al. |
| 6,316,052 | B1 * | 11/2001 | Shiokawa .................. 427/237 |
| 6,365,420 | B2 * | 4/2002 | Ashida ......................... 438/3 |
| 6,391,785 | B1 | 5/2002 | Satta et al. |
| 6,416,577 | B1 | 7/2002 | Suntola et al. |
| 6,468,903 | B2 | 10/2002 | Bolscher et al. |
| 6,537,461 | B1 | 3/2003 | Nakahara et al. |
| 6,664,192 | B2 | 12/2003 | Satta et al. |
| 6,720,259 | B2 | 4/2004 | Londergan et al. |
| 6,890,596 | B2 | 5/2005 | Sarigiannis et al. |
| 7,118,779 | B2 | 10/2006 | Verghese et al. |
| 2002/0018849 | A1 * | 2/2002 | George et al. .......... 427/255.27 |
| 2002/0022265 | A1 | 2/2002 | Bailey et al. |
| 2004/0023516 | A1 | 2/2004 | Londergan et al. |
| 2004/0134427 | A1 | 7/2004 | Derderian et al. |
| 2006/0040054 | A1 * | 2/2006 | Pearlstein et al. ........ 427/248.1 |

FOREIGN PATENT DOCUMENTS

| | | |
|---|---|---|
| JP | 2001-20075 | 1/2001 |
| JP | 2003-511560 | 3/2003 |
| WO | WO 01/27346 A1 | 4/2001 |
| WO | WO 01/40541 A1 | 6/2001 |
| WO | WO 02/088421 A1 | 11/2002 |
| WO | WO 2004/063421 A2 | 7/2004 |

OTHER PUBLICATIONS

Chen et al., "Surface Modification for Area-selective Atomic Layer Deposition," NSF/SRC Engineering Research Center for Environmentally Benign Semiconductor Manufacturing, pp. 1-33 (2003).

Mui et al., "Surface Modification for Selective Atomic Layer Deposition of High-κ Dielectric Materials," NSF/SRC Engineering Research Center for Environmentally Benign Semiconductor Manufacturing, pp. 1-21 (2002).

Hermann, et al., "Conformal hydrophobic coatings prepared using atomic layer deposition seed layers and non-chlorinated hydrophobic precursors", Journal of Micromechanics and Microengineering vol. 15, 2005, pp. 1-9.

File wrapper for U.S. Appl. No. 11/565,478, filed Nov. 30, 2006.

Office Action for U.S. Appl. No. 11/565,478 dated Mar. 19, 2010.

* cited by examiner

REACTOR SURFACE PASSIVATION THROUGH CHEMICAL DEACTIVATION

REFERENCE TO RELATED APPLICATION

This application is a divisional of U.S. patent application Ser. No. 10/841,585, filed May 7, 2004, now U.S. Pat. No. 7,118,779, which claims the priority benefit under 35 U.S.C. §119(e) to provisional patent application No. 60/469,181, filed May 9, 2003, the entire contents of these applications are hereby incorporated by reference herein.

FIELD OF THE INVENTION

The present invention generally relates to inhibiting deposition on reactor surfaces in chemical vapor deposition (CVD) and atomic layer deposition (ALD) reactors. More specifically, the present invention relates to de-activating a surface of the reactor to limit coating by subsequent gases flowing through the reactor.

BACKGROUND OF THE INVENTION

Atomic layer deposition (ALD) is a known process in the semiconductor industry for forming thin films of materials on substrates such as silicon wafers. ALD is a type of vapor deposition wherein a film is built up through self-saturating reactions performed in cycles. The thickness of the film is determined by the number of cycles performed. In an ALD process, gaseous precursors are supplied, alternatingly and repeatedly, to the substrate or wafer to form a thin film of material on the wafer. One reactant adsorbs in a self-limiting process on the wafer. A subsequent reactant pulse reacts with the adsorbed material to form a single molecular layer of the desired material. Decomposition may occur through reaction with an appropriately selected reagent, such as in a ligand exchange or a gettering reaction. In a typical ALD reaction, no more than a molecular monolayer forms per cycle. Thicker films are produced through repeated growth cycles until the target thickness is achieved.

In an ALD process, one or more substrates with at least one surface to be coated and reactants for forming a desired product are introduced into the reactor or deposition chamber. The one or more substrates are typically placed on a wafer support or susceptor. The wafer support is located inside a chamber defined within the reactor. The wafer is heated to a desired temperature above the condensation temperatures of the reactant gases and typically below the thermal decomposition temperatures of the reactant gases. The wafer can sometimes be heated to above the decomposition temperature since some variations on ALD processes (e.g., "cyclical" or "digital" CVD) rely on the decomposition of the precursor onto the wafer surface. In such variants, decomposition can be minimized on the other parts of the reactor by using zonal temperature control (keeping other parts of the reactor cooler than the susceptor) or by decreasing the residence time of the gases in the reactor.

A characteristic feature of ALD is that each reactant is delivered to the substrate in a pulse until a saturated surface condition is reached. As noted above, one reactant typically adsorbs on the substrate surface and a second reactant subsequently reacts with the adsorbed species during the subsequent pulse. To obtain a self-limiting growth, vapor phase reactants are kept separated by purge or other removal steps between sequential reactant pulses. Since growth of the desired material does not occur during the purge step, it can be advantageous to limit the duration of the purge step. A shorter duration purge step can increase the available time for adsorption and reaction of the reactants within the reactor, but the vapor phase reactants are not allowed to mix to avoid the risk of CVD reactions destroying the self-limiting nature of the deposition. As the growth rate is self-limiting, the rate of growth is proportional to the repetition rate of the reaction sequences, rather than to the temperature or flux of reactant as in CVD.

Invariably, deposition occurs on ALD reactor surfaces other than the substrate surface during processing. Over time, a film buildup on the surfaces of the reactor can occur. The film buildup can delaminate from the reactor surfaces and contaminate the substrate surface. Large amounts of loosely adhered film buildup on the reactor surfaces increases the total surface area exposed to a reactant pulse. Hence, this can also increase the pulse and purge time required to saturate the wafer surface Hot CVD reactant parts similarly face deposition build-up, although such coating can be minimized by keeping reactors parts exposed to reactants gases cooler than the CVD temperature. On the other hand, cooler CVD reactant parts may be subject to reactant condensation or adsorption/desorption, as in ALD reactors, leading to contamination problems again.

Frequent cleaning of the reactor can limit the potential for contamination. However, the reactor is out of service during these cleanings and thus reduces the efficiency of the ALD or CVD process.

SUMMARY OF THE INVENTION

The systems and methods of the present invention have several features, no single one of which are solely responsible for its desirable attributes. Without limiting the scope of this invention as expressed by the claims which follow, its more prominent features will now be discussed briefly. After considering this discussion, and particularly after reading the section entitled "Detailed Description of the Preferred Embodiments," one will understand how the features of this invention provide several advantages to vapor deposition methods and systems.

According to one aspect of the invention, a method is provided for deactivating surfaces of a vapor deposition reaction space. The surfaces are treated to render the vapor deposition process conducted therein selective to the substrate, rather than the treated surfaces. In one embodiment, treatment comprises an ex situ treatment prior to assembly of the parts defining the reaction space. In another embodiment, treatment and periodic re-treatment can be conducted in situ by flowing a treatment gas through the reaction space to deactivate reaction space surfaces.

In accordance with another aspect of the invention, a vapor deposition reactor is provided with at least some of the surfaces that define a reaction space being deactivated by a monolayer that inhibits deposition reactions thereon. In the example of an atomic layer deposition (ALD) reactor, the monolayer is nonreactive with the reactants under the conditions prevalent during deposition.

In accordance with another aspect of the invention, a method of treating and operating a reaction space surface of a vapor deposition reactor includes treating the reaction space surface with a treatment chemical. The treatment deactivates the reaction space surface against reaction with a plurality of deposition reactions. A substrate is loaded into the reaction space after this treatment. A layer is deposited onto the substrate by exposing the substrate to the plurality of reactants.

In accordance with another aspect of the invention, a vapor deposition apparatus is provided with a plurality of reaction space surfaces that define a reaction space. A substrate support structure is housed within the reaction space. A plurality of feedlines connect the reaction space to sources of vapor phase reactants suitable for a vapor deposition process. At least some of the reaction space surfaces include a surface modification deactivating such surfaces against the vapor deposition process.

In accordance with another aspect of the invention, a deposition system is provided with a reactor that has a deposition chamber for depositing a film onto a substrate. Surfaces of the deposition chamber is coated with reactive sites selected from the group consisting of —OH, nitrogen, hydrogen and halide surface groups. A substrate support is located within the reactor and configured to support the substrate. A treatment gas source contains a treatment gas. An inlet line in flow communication with the treatment gas source is configured to supply the treatment gas to the surfaces of the deposition chamber. The treatment gas is selected to bind to the reactive sites to form a protective layer on the surfaces of the deposition chamber, which protective layer reduces the likelihood of the film depositing on the surfaces of the deposition chamber.

In the illustrated embodiments, the deactivation is provided by adsorption of treatment reactants upon reaction space surfaces. The treatment process binds available reactive sites, occupying or otherwise preventing such reactive sites from exposure to deposition reactants in subsequent processing. For example, —OH molecules are often present on the surfaces of metal reaction space surfaces and oxide-passivated metal surfaces (e.g., titanium coated with aluminum oxide). Such —OH termination readily reacts with typical ALD precursors. Similarly, other types of reactive sites can be present. A treatment gas causes adsorption of treatment reactant, binding the —OH groups and leaving a termination that is nonreactive to the particular ALD reactants that are connected to the reactor for deposition. In particular, the strength of the bond between the treatment reactant (absorbed largely intact) and the reaction space surfaces is strong enough to avoid desorption or chemical reaction with the deposition reactants.

Major benefits of the deactivation process are a considerable reduction in deposition buildup on the reaction chamber surfaces, reduced downtime for reactor cleaning and reduced particulate generation. Furthermore, time to remove reactants between deposition steps can be considerably reduced by the fact that reactants do not readily adhere to the walls. This is a particularly significant advantage for ALD, wherein removal steps (typically purging with inert gas) are repeatedly employed between each reactant pulse to avoid gas phase reactions. Deactivation of reaction space surfaces against the deposition reactions permit effective purging with greatly reduced purging times. In the context of ALD, "effective" purging entails purging such as to prevent undue risk of gas phase mixing between successive reactant pulses. This not only reduces the cycle time for an ALD step but also results in more uniform deposition films on the substrate by reducing gas phase CVD reactions.

BRIEF DESCRIPTION OF THE DRAWINGS

These and other aspects of the invention will be readily appreciated in view of the detailed description below and the appended drawings, which are meant to illustrate and not to limit the invention, and in which.

DETAILED DESCRIPTION OF THE PREFERRED EMBODIMENTS

Features, aspects and advantages of the present invention will now be described with reference to the drawings of the preferred embodiments, which embodiments are intended to illustrate and not to limit the invention.

Figure 1:
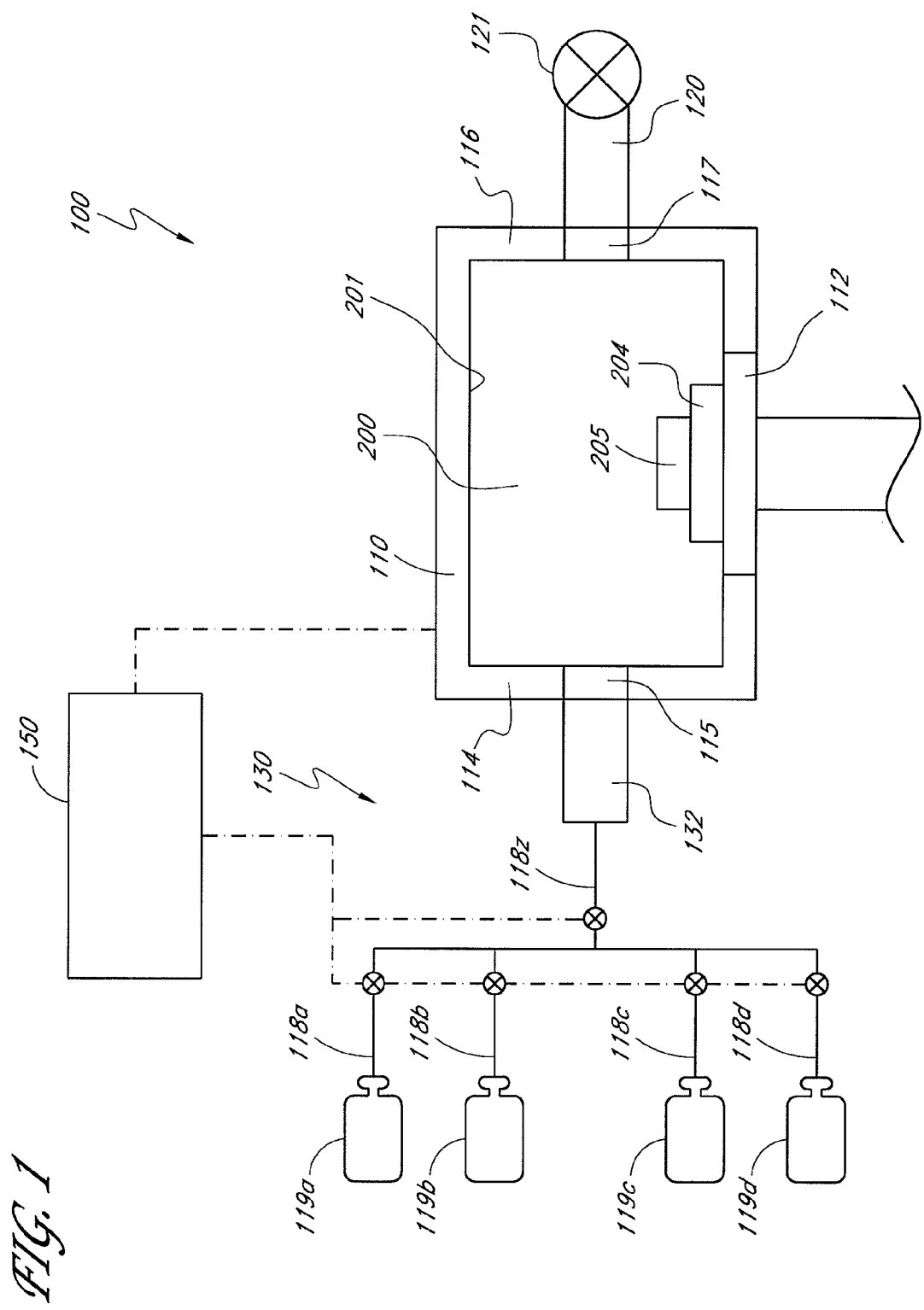
FIG. 1 is a schematic cross-sectional view of an ALD reactor.

FIG. 1 is a schematic view of an atomic layer deposition (ALD) reactor 100. The ALD reactor 100 is an exemplary device that benefits from treatment as described herein to deactivate reactor surfaces subjected to deposition reactant vapors. Alternatively, the treatment described herein can be used in other semiconductor process tools, for example, a chemical vapor deposition (CVD) reactor. However, the treatment is not limited to use with semiconductor processing tools, but is useful for protection of chemical reaction tools used in a variety of industries. Exemplary industries include aerospace, chemical, and electric industries.

The treatment is applicable to a variety of common reactor materials, particularly metals including titanium, titanium alloys, titanium dioxide, nickel, nickel alloys, stainless steel, and aluminum oxide (often employed as a passivation layer over metal reactor surfaces), as well as glass and quartz, etc. Such surfaces have been found susceptible to formation of reactive sites (e.g., OH— termination) that can lead to unwanted coating during deposition. Conventional oxide (e.g., aluminum oxide, $Al_2O_3$) passivation similarly includes —OH surface termination. The treatment is particularly useful for titanium surfaces which accumulate an undesirable film buildup. Titanium and similar surfaces may be susceptible to surface damage when conventional cleaning techniques are applied. For example, the use of etching solutions is a conventional cleaning technique that can often pit or corrode a titanium surface, such that titanium particularly benefits from minimizing the frequency of cleaning. While $Al_2O_3$ passivating can protect against corrosion during reactor operation, such during cleaning treatments, such passivation can exacerbate deposition buildup. Typically, ALD and CVD reactors must be frequently taken out of production, disassembled, and treated with etch chemicals for removal of deposition buildup. Conventional oxide passivation is then applied prior to re-assembly and a set number of depositions before cleaning is again required. Typically, reactor surfaces that benefit from the treatment described herein are characterized by hydrophilic termination prior to treatment.

The ALD reactor 100 comprises a top member 110, a bottom member 112, an inlet side member 114, and an exhaust side member 116 which together form a portion of a housing for the ALD reactor 100. The inlet side member 114 and the exhaust side member 116 includes orifices 115 and 117, respectively. As illustrated in FIG. 1, the housing defines a deposition chamber 200. Of course additional sidewalls (not shown in the schematic cross-section) cooperate with the illustrated walls to enclose the deposition chamber 200.

It will be understood that the reactor 100 of FIG. 1 is shown schematically only and that vapor deposition reactors can take on a variety of configurations. The description herein of the treatment process is not limited to any particular configuration. For example, both ALD and CVD reactors can employ upstream merger of gas lines as shown in FIG. 1. On the other hand, many vapor deposition reactors, and particularly ALD reactors, employ systems in which reactants are kept separate until injection into the reaction chamber, thereby minimizing common lines upstream of the reaction chamber. In those cases, treatment can be conducted on the reaction chamber surfaces only, and possibly some of the immediately downstream exhaust surfaces. Furthermore, while illustrated as a horizontal, laminar flow type of single wafer reactor, the treatments described herein are applicable to batch systems and other types of flow systems (e.g., showerhead, atmospheric, LPCVD, etc.).

A substrate support or susceptor 204 is located within the ALD reactor 100 and is configured to support one or more substrates or wafers (one wafer 205 shown) during the deposition process. Prior to processing, one or more substrates are placed on the substrate support or susceptor 204. In some arrangements, the substrate support 204 is adapted to rotate within the deposition chamber 200. Once processing is complete, the wafer 205 can be removed from the deposition chamber 200. The reactor 100 also includes heating means to maintain the substrate(s) at suitable deposition temperatures and optionally separate heating means for controlling wall surfaces.

The ALD reactor further includes a gas distribution system 130. The gas distribution system 130 includes at least two gas inlet lines 118a-n leading from vapor sources 119a-n and an exhaust line 120 leads to a vacuum pump 121. The inlet lines 118a-n are in flow communication with the reaction chamber 200 via at least one orifice 115. The exhaust line 120 is in flow communication with the reaction chamber 200 via at least one orifice 117. The gas distribution system 130 is illustrated as having a common space in the form of a mixer chamber 132 upstream of the reaction chamber 200. The mixer chamber 132, reaction chamber 200, and any intervening distribution manifold are thus subject (at different times in ALD, and simultaneously in CVD) to at least two mutually reactive reactants, and in the illustrated arrangement, to all reactants. Thus the mixer chamber 132 and reaction chamber 200 together define a reaction space. The gas distribution system 130 and the mixing chamber 132 is not limited to only one side of the reactor as shown in FIG. 1. The system may have multiple and separate gas distribution systems and mixing chambers which may be used, for instance to separate incompatible (mutually reactive) gases until the reaction space 200. In cases where only the reaction chamber 200 is subject (simultaneously or sequentially) to multiple reactants, then the reaction chamber 200, together with immediately downstream portions of the exhaust system, defines the reaction space. Thus, it will be understood that "reaction space," as used herein, refers to the surfaces subject to multiple, mutually reactive reactants.

The gas distribution system is configured to route reactant and purge gases through the ALD reactor 100. For example, the gas distribution system 130 periodically routes reactant gases that enter the ALD reactor via inlet lines 118a, 118b to the deposition chamber 200. More specifically, the gas distribution system 130 routes a first reactant gas, via the first reactant inlet 118a line, and the mixer chamber 132 to the deposition chamber 200. Once in the deposition chamber 200, a portion of the first reactant gas adsorbs on the surface of the wafer 205. As explained above, the first vapor phase reactant can disadvantageously adsorb on other surfaces within the deposition chamber 200 or the inlet lines 118. Next, the gas distribution system routes a purge gas, via purge inlet line 118c, to the deposition chamber 200. The purge gas displaces the portion of the first reactant gas that was not adsorbed on the surface of the substrate or wafer, as well as possible byproduct. The displaced portion of the first reactant gas and the purge gas exits the deposition chamber 200 via the exhaust line 120. Thereafter, a second vapor phase reactant is provided to react with the adsorbed monolayer, via the second reactant inlet line 118b and excess second reactant and byproduct is purged. In some arrangements, ALD cycles can also include third, fourth, etc. reactant pulses, with attendant purge steps.

Besides the reactant and purge gases, the illustrated gas distribution system can periodically route one or more treatment gases by a treatment line 118d to the deposition chamber 200. The gas distribution system preferably routes each treatment gas to the deposition chamber 200 via a shared inlet line 118(z), as shown, where the deposition reactants share some pathway upstream of the reaction chamber 200. As described in more detail below, each treatment gas can provide a benefit to ALD processing. For example, depending on which treatment gas is selected, a first treatment gas, in combination with any pre-existing surface termination of the deposition chamber 200, can desirably adhere to those surfaces to deactivate the reaction space surfaces against processing (e.g., deposition) reactant gases adhering to those same surfaces during operation. In this way, treatment reactant, deposition reactant, and purge gases enter the housing via inlet lines 118a-n and exit the housing via the exhaust line 120.

As will be understood by the skilled artisan in view of the disclosure herein, the treatment gas can comprise a mixture of gases. For example, many treatment gases suitable for chemical adsorption on reactor surfaces will be solid or liquid under standard conditions. Accordingly, such treatment gases will most preferably be delivered to the reaction chamber by vaporization in a separate source vessel and entrained in an inert carrier gas flow from the source vessel to the reactor surfaces. Such delivery is particularly applicable to in situ vapor phase treatment of reactor surfaces, but can also be applied to ex situ treatment of reactor parts, as will be understood from the disclosure below. Moreover, the treatment gas can comprise a mixture of reactive gases.

In addition to the treatment gas, a pre-treatment gas can be optionally introduced into the deposition chamber 200. This second or pre-treatment gas could be introduced into the deposition chamber 200 before or in combination with the treatment gas described above. In a particularly preferred embodiment of the invention, this pre-treatment gas is an oxygen-containing gas for pre-treatment or preparation of the reaction space surfaces. The oxygen-containing gas is preferably introduced into the reaction chamber 200 prior to introducing the first treatment gas. The oxygen-containing gas advantageously prepares the surfaces of the deposition chamber 200 for more complete reaction with the first treatment gas by forming chemical bonds with the surfaces of the deposition chamber 200. Once the oxygen-containing gas forms these chemical bonds, the surfaces of the deposition chamber 200 are more susceptible to the subsequent treatment gas, forming a more densely packed passivation against reactant gases adhering on those same surfaces. In the illustrated embodiments, the pre-treatment can be characterized by creating a more hydrophilic surface, whereas the treatment can be characterized as creating a more hydrophobic surface. The incorporation of such pre-treatment and treatment to deactivate reactor surfaces is further described with reference to FIGS. 2A and 2B. As also described with respect to FIGS. 3 and 4, pre-treatment can be conducted by exposure to liquid phase chemicals, such as in ex situ treatment of reactor parts. In such cases, the reactor need not include a source of vapor phase treatment chemical.

The gas distribution system can include additional inlet lines (not shown). For example, the gas distribution system can include a greater number of inlet lines 118a-n which are designated for treatment, deposition reactant, and inert gases depending on the configuration of the ALD reactor 100. Moreover, each inlet line may or may not be coupled to one or more additional gas flow lines. For example, one or more inlet lines designated for reactant gases may be coupled upstream of the illustrated source containers 119a-n to sources of carrier gases (e.g., for a bubbler) while another reactant source is a simple container or gas bomb for reactant that is naturally gaseous under standard conditions. Thus, in the illustrated embodiment, the inlet lines 118a-n flow reactant gases from reactant gas sources and/or liquid vapor sources (e.g., an evaporator or a bubbler). The inlet line 118d allows a treatment gas to flow from a treatment gas source 119d to the deposition chamber 200. The inlet line 118c allows an inert gas to flow from the inert gas source 119c. An exemplary inert gas for purging or carrier is a nitrogen gas ($N_2$).

As noted, the illustrated gas distribution system 130 also includes a mixing device 132. The mixing device 132 mixes the gases from the intake lines 118a-n prior to the gases entering the deposition chamber 200. For example, during ALD, it may be desirable to mix one reactant with an inert carrier gas flow. Additionally, although ALD reactants are not mixed in the gas phase, the fact that two ALD reactants sequentially flow through the same space in the mixer means that second reactants react with adhered first reactants on the mixer internal surfaces from the previous first reactant pulse, causing deposition. Such controllable deposition upstream of the reaction chamber is preferred as a sacrificial reaction, as compared to allowing first reactant to desorb from reactor surfaces during the second reactant pulse, which could lead to uncontrolled, non-self-limiting CVD-like reactions in the reaction chamber 200. The mixer chamber 132 can then be periodically cleaned. A mixing device may or may not be employed. In some simple ALD configurations, one gas can be introduced from one side of the reactor and another from another side of the reactor. In this case, the only space shared by the reactants is the reaction chamber 200 itself, apart form the exhaust lines 120.

For ease of explanation, the deposition chamber 200 region, along with any portion of the adjoining gas distribution system which is subjected to at least two reactant gases or a mixture of gases, is defined as a portion of a "reaction space." Unlike a line within the gas distribution system that is exposed to only one reactant, lines exposed to more than one reactant gas are particularly susceptible to film buildup on their inner surfaces. Thus, deposition on reactor surfaces occurs not only in the mixer 132, but also occurs on the surfaces of the deposition chamber 200, inner surfaces of the exhaust line 120 in immediate communication with the chamber 200, and the shared inlet gas line 118z that is located downstream of the mixer device 132 and upstream of the deposition chamber 200.

An ALD control system 150 is configured to control the ALD reactor 100 before and during processing of the wafer. For example, the ALD control system can include control software and electrically controlled valves to control the flow of reactant and purge gases into and out of the ALD reactor 100. In one embodiment, the ALD control system also controls the flow of the treatment gas into the ALD reactor 100 to deactivate the surface against ALD reactions, such as by forming a protective layer on an inner surface of the reaction space. After deactivating the surfaces, the ALD control system 150 loads substrate(s) into the deposition chamber 200 and flows reactant and/or purge gases into the ALD reactor 100 to form a deposit on the substrate 205 (e.g., silicon wafer). The ALD control system 150 can include modules such as a software or hardware component, e.g., a FPGA or ASIC, which performs certain tasks. A module can advantageously be configured to reside on the addressable storage medium of the ALD control system 150 and be configured to execute on one or more processors.

The treatment reactant or chemical bathes at least a portion of the reaction space prior to processing of the wafer or substrate. This reaction space can include a portion of the inner surface of the ALD reactor 100. The treatment chemical preferably binds or occupies reaction sites on the reaction space surfaces. In some arrangements, the treatment chemical is provided as a solution in the liquid phase. In the embodiment of FIG. 1, the treatment chemical is provided from the treatment source 119d in the vapor phase to the reaction space, in which case the unused treatment gas along with any by-products from the reaction are exhausted from the ALD reactor 100 via the exhaust line 120. The ALD control system 150 controls one or more valves to allow or prevent the various gases, including the treatment gas, from reaching the ALD reactor 100 before and during processing. One or more of the various gas sources 119 can be pressurized or not, and can be heated to vaporize reactants from solid or liquid state.

As described, the treatment gas can be applied or reapplied to a portion of the reaction space by flowing the treatment chemicals in a vapor phase or gaseous form through the inlet line 118d and into the deposition chamber 200. This process is described hereinbelow with reference to FIG. 4. However, the invention is not so limited.

In another embodiment, the treatment can be applied or reapplied directly to a portion of the reaction space prior to or after assembly of the deposition chamber 200. For example, treatment chemicals, in a liquid or gaseous state, can be applied to one or more of the components of the reaction space before the deposition chamber 200 is assembled from those components. This process is described hereinbelow with reference to FIG. 3. Thus, treatment liquid could be applied to, for example, the mixer device 132 prior to assembly of the ALD reactor 100. In this case, treatment chemicals can also be directly applied or reapplied to portions of the reaction space after assembly of the ALD reactor 100. This reapplication can occur after use of the deposition chamber 200 for ALD processing, such as by disassembly and ex situ treatment, per FIG. 3, or by periodic in situ treatment, per FIG. 4. The re-treatments maintain the effectiveness of the initial treatment during use of the ALD reactor 100.

Figure 2B:
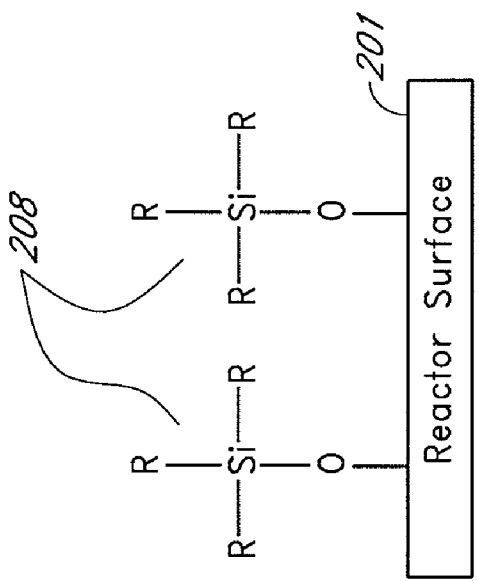
FIGS. 2A and 2B are drawings of an exemplary chemical reaction, which results in deactivation of reactor surfaces within the reaction space.
Figure 2A:
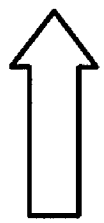
Figure 2A:
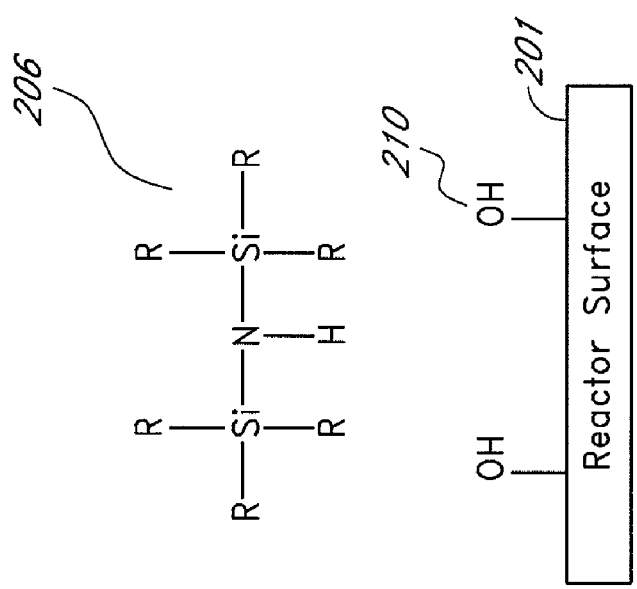

FIGS. 2A and 2B are drawings of an exemplary chemical reaction between a treatment chemical or reactant 206 and reactive sites on reaction space surfaces. In the illustrated embodiment, the reactive sites include —OH surface groups 210 on a surface 201 of the reaction space. The chemical reaction results in the formation of a protective layer 208. The protective layer 208 passivates or deactivates selected surfaces that define the reaction space to reduce the likelihood that undesirable deposits will form on the treated surfaces during processing of the wafer or substrate. Typically, naturally occurring —OH surface groups 210 serve as reaction or adsorption sites for the deposition reactants during operation of the reactor. Thus, by forming a layer of the protective coating 208 that bonds with, occupies, or otherwise deactivates these reaction or adsorption sites on the surface 201, these same reaction or adsorption sites become unavailable to the reactant gases. Unwanted deposition is thus avoided. Furthermore, in comparison to purging an untreated reaction space, the cycle time for purging a reaction space defined by treated surfaces is reduced since the reactant gases are less likely to adhere to the surfaces of the treated reaction space. Thus, the treatment chemical or reactant 206 is preferably non-reactive with deposition reactants and does not readily desorb under the conditions that attend the subsequent processing (e.g., ALD or CVD). Selection of the treatment reactant thus depends, in part, on the reactants to be employed, and conditions under which processing (e.g., deposition) will take place.

The protective layer 208 can form on one or more surfaces within the reaction space, including one or more inner surfaces of the deposition chamber 200 (FIG. 1), the upstream mixer 132, any common lines 118z for the reactants, exposed surfaces of the wafer support 204, and/or other surfaces within the reaction space.

Preferably, the desired reaction space surface(s) are treated or re-treated to form the protective layer 208 thereon prior to loading and processing a wafer or substrate. As will be more clear from a discussion of FIG. 3 below, the treatment can be provided ex situ on reactor parts, such as by exposure to vapor phase treatment reactant 206, or by dipping reactor parts into a liquid solution of the treatment chemical, prior to reactor assembly. Alternatively, as discussed with respect to FIGS. 1 and 4, the treatment can be performed in situ by feeding a vapor phase treatment reactant 206 through the reaction space of an assembled reactor 100.

In an embodiment of the invention, a pre-treatment or preparatory reactant is applied to at least a portion of the reaction space surface prior to introducing the previously described treatment reactant. For ease of explanation, this pre-treatment reactant is also referred to herein as a "second" treatment gas even though the second treatment gas is preferably applied to the surface of the reaction space prior to applying the treatment reactant. Application of the pre-treatment reactant to the reaction space surface enhances the subsequent formation of the protective layer 208 by ensuring maximum packing density of the —OH surface groups 210 or other reactive sites. In the illustrated embodiment, the pre-treatment reactant includes oxygen, such as ozone. The oxygen atoms from the ozone bind naturally to free H atoms to form additional —OH surface groups 210, in addition to the existing or original —OH surface groups 210. These additional —OH surface groups 210 form additional reaction sites on the reaction space surfaces for subsequent bonding to the first treatment reactant. In this way, the molecules that form the protective layer are more closely packed on the reaction space surface. When the treatment reactant 206 is subsequently provided to the reaction space surface, the treatment reactant can chemically react with the —OH surface groups 210 of a fully hydroxylated surface to ensure full inactivation of all available reaction sites.

Note that, while —OH surfaces groups are discussed herein as reactive sites on reaction surfaces, in some arrangements different surface groups will serve as the reactive sites. Thus, either naturally occurring or intentionally produced surface groups that are susceptible to chemisorption by the treatment chemical can include, for example, nitrogen, hydrogen, or halide termination. Pre-treatment to maximize the density of such reactive groups can therefore include exposure to hydrogen-bearing reactants (e.g., $H_2$, HF, etc.), nitrogen-bearing reactants (e.g., $NH_3$, hydrazine, etc.), and halide-bearing reactants (e.g., $NF_3$, $CF_4$ or other chloro- or fluorocarbons, etc.). Furthermore, the list of reactive terminations hereinabove is not an exclusive list, and reactive sites can comprise a mixture of different types of surface groups. The optional pre-treatment step, if employed, should increase and preferably maximize the availability of reactive sites for ensuring complete surface passivation by the subsequent treatment reactant. This improves the packing density of the treatment reactant on the reactor surface and typically results in the deactivation film being more stable and effective.

Additionally, or alternatively, a fuller deactivation of available reaction sites can be facilitated by pulsed exposure of the treatment reactant to the reaction space surface. As is known in the art of ALD, one cycle of ALD typically does not result in a full molecular monolayer of the material to be deposited. Rather, steric hindrance by ligands attached to vapor phase reactants, which ligands are typically still attached when the reactant adsorbs on the substrate of interest, blocks some potential reaction sites. A subsequent reactant will strip the ligands, exposing more available reaction sites, but again another adsorption pulse will block some of those reactive sites. Accordingly, on average, many cycles can be required to obtain a full molecular monolayer. In reality this phenomenon exhibits itself in the form of a deposition rate, in angstroms per cycle, that is significantly below the lattice constant of the material being deposited.

Similarly, where the treatment reactant operates by adsorption on reactive sites on the reaction space surfaces, steric hindrance can prevent full occupation of all available reactive sites, whether or not the surface has been pre-treated. Therefore, it may be advantageous to repeatedly pulse exposure of the reaction space surface to the treatment reactant. For example, for in situ treatment, treatment can comprise a prolonged exposure to the treatment chemical, or a plurality of treatment reactant pulses separated by purging steps.

The exemplary treatment reactant 206 illustrated in FIG. 2A is the chemical compound alkyldisilazane. However, the invention is not limited to the chemical compound illustrated in FIG. 2A. As will be explained below, other chemical compounds capable of deactivating surface reaction sites can be used. For example, processes for selective ALD on selected portions of a wafer are disclosed in a presentation by Collin Mui, Stacey F. Bent, and Charles B. Musgrave at Stanford University, Stanford Calif., titled "Surface Modification for Selective Atomic Layer Deposition of High-k Dielectric Materials" and published in 2002 (hereinafter "Mui et al.") along with a presentation by Rong Chen, Hyoungsub Kim, Stacey F. Bent, and Paul C. McIntyre at Stanford University, Stanford, Calif., titled "Surface Modification for Area-selective Atomic Layer Deposition" and published in 2003 (hereinafter "Chen et al."). Both references are hereby incorporated by reference in their entireties. Exemplary chemical compounds may include a lone electron pair and/or a reactive halogen group.

The treatment reactant 206 desirably reacts with the reaction space surface 201 in a manner that fully occupies available reactive sites and remains stable under the reactor operation conditions (e.g., from ALD preferably 200° C. to 500° C., more preferably from 250° C. to 400° C.). Experiments were conducted with small treatment reactant molecules such as are readily deliverable in the gas phase (e.g., trichloroethylsilane, chlorotrimethylsilane, bromotrimethylsilane). While Chen et al. found these treatments to either not completely cover the desired substrate surface or to too readily volatilize under ALD conditions, the skilled artisan will readily appreciate even such treatment reactants will improve the performance of the reactor by reducing buildup on reactor walls. Furthermore, the effectiveness of gas phase delivery can be improved by proper selection of the treatment chemical, optimization of the delivery process, use of pre-treatment, pulsed treatment, more frequent re-treatment, etc.

In order to more densely cover substrate surfaces and withstand higher temperatures without desorption, Chen et al. investigated molecules more typically provided in a liquid phase, more particularly polymerizable molecules for creating self-assembled monolayers (SAMs). Silylating agents such as octadecyltrichlorosilane ($CH_3$—$(CH_2)_{17}$—$SiCl_3$, or ODTCS for short), was employed, as described in more detail below.

In FIG. 2A, the chemical reaction that forms the protective layer 208, has yet to occur. Thus, the surface in FIG. 2A is in an untreated state. In this untreated state, the surface 201 preferably includes one or more —OH surface groups 210 (or other reactive sites). The —OH groups 210 are capable of reacting with the treatment gas 206. If the —OH groups 210 are not deactivated by reacting with the treatment gas 206, then the —OH groups may react with the reactant gases (e.g., CVD or ALD precursors) during subsequent wafer processing.

Since CVD entails elevated temperatures for thermal decomposition of the reactant to occur on the reaction surfaces of a CVD reactor, different criteria may be employed for selection of the treatment reactant for CVD reactor surfaces, as compared to ALD reactor surfaces. In CVD the substrate or wafer surface is subjected to the elevated temperatures by a thermal system whereby the reactant gas decomposes thereon. Depending on the design of the CVD reactor, the thermal system may increase the surface temperature of reaction space surfaces in addition to the surface of the substrate. This increase in temperature of the reaction space may desorb the protective layer. However, thermal management steps can be taken to improve the life cycle of the protective layer in the CVD reactor. For example, cold wall thermal systems could be incorporated into the CVD reactor to limit heat to the substrate and substrate support while keeping other surfaces relatively cold. Alternatively, the treatment reactant can be selected to bind more strongly to the reaction space surfaces.

To prevent a reaction or chemical bond from forming between the —OH groups 210 (or other reactive sites) and the deposition reactants during processing of the wafer, a part of the treatment reactant 206 bonds to the surface 201 by reacting with the —OH groups. For example, if the chemical compound selected for the treatment reactant 206 is alkyldisilazane, the oxygen atoms of the —OH groups 210 on the reaction space surface 201 form chemical bonds with the silicon atoms of the alkyldisilazane, thereby liberating ammonia ($NH_3$). The formation of chemical bonds between these silicon atoms and the oxygen atoms and non-reactive organic tails form the protective layer 208 on the surface 201 as illustrated in FIG. 2B. Note that the protective layer 208 is less than five molecular monolayers, preferably no more than about two monolayers in thickness, and most preferably represents about one monolayer in thickness of the reactant molecule 206. Preferably the protective layer 208 uniformly coats the target reaction space surface(s) 201 due to the self-saturating nature of the adsorption process, as will be appreciated by the skilled artisan. Once formed, the surface 201 is in a treated state and is less likely to form deposits thereon during wafer processing. The protective layer 208 created by the organic treatment reactants of Chen et al. creates a hydrophobic surface for the processing gases to inhibit deposition by certain types of ALD chemistries on the surface 201.

The chemical compound alkyldisilazane is an exemplary compound for the treatment reactant 206. As described in the above incorporated presentation by Chen et al., other exemplary compounds include organosilanes and compounds with reactive halogen groups. Exemplary organosilanes are alkyldisilazanes, aryldisilazanes, and alkylaryldisilazanes (Formula 1); and alkylhalosilanes, arylhalosilanes, and alkylarylhalosilanes (Formula 2). Treatment reactant chemical selection is typically based on the operating conditions for the ALD reactor. For example, if the deposition process takes place at 400° C. and creates corrosive byproducts such as HCl, the treatment film formed on the reactor surfaces must be able to withstand such conditions without decomposing or reacting. Packing density on the reactor surface is also an important criteria for chemical selection.

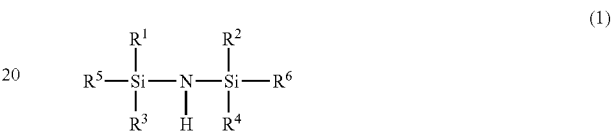

(1)

In Formula (1), $R^1$ through $R^6$ are each individually $C_1$ to $C_6$ alkyl or $C_6$ to $C_{10}$ aryl. Formula (1) includes alkyldisilazanes where $R^1$ through $R^6$ are alkyl, aryldisilazanes where $R^1$ through $R^6$ are aryl, and alkylaryldisilazanes where at least one of $R^1$ through $R^6$ is an alkyl and at least one of $R^1$ through $R^6$ is an aryl.

(2)

In Formula (2), $R^7$ through $R^9$ are each individually selected from the group consisting of $C_1$ to $C_{20}$ alkyl and $C_6$ to $C_{10}$ aryl; where p, q, and r are each 0, 1, 2, or 3 with the proviso that $1 \leq p+q+r \leq 3$; and where each X is a halogen atom. Formula (2) includes alkylhalosilanes where $R^7$ through $R^9$ are alkyl, arylhalosilanes where $R^7$ through $R^9$ are aryl, and alkylarylhalosilanes where at least one of $R^7$ through $R^9$ is an alkyl and at least one of $R^7$ through $R^9$ is an aryl.

Large organic molecules with halide termination can form self assembled monolayers (SAMs) on the reactor surface that are very stable and do not easily desorb from the surface. In addition, large organic tails provide steric hindrance effect and do not allow the ALD reactant to reach the reactor surface. While the steric hindrance effect can be minimized, as discussed above, to maximize occupation of reactive sites that can otherwise form nuclei for deposition reactants during subsequent operation, in some situations the steric hindrance can provide stable and more thorough coverage. Large reactants that form SAMs, for example, can enhance the protective effect through steric hindrance, such as the monomer. Octadecyltricholrosilane (ODTCS) as disclosed by Chen et al.

Figure 2C:
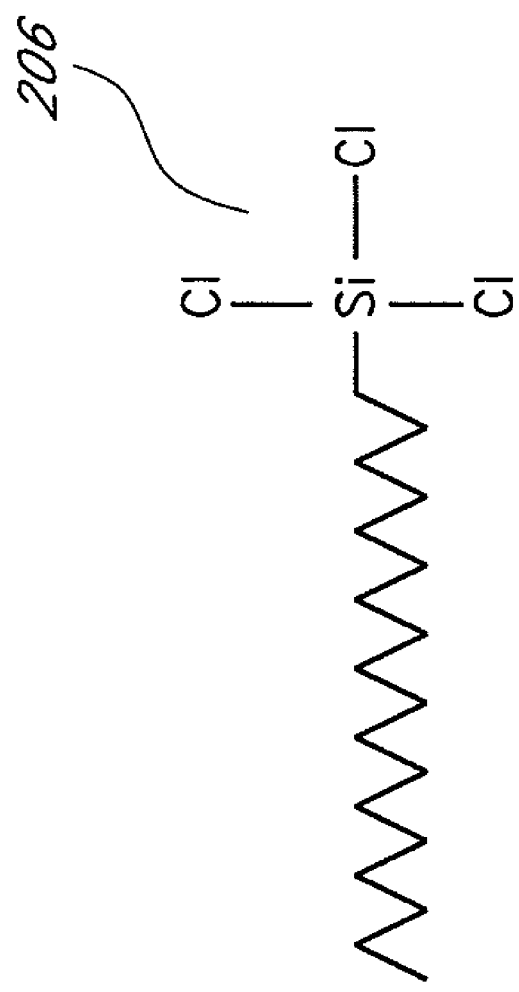
FIGS. 2C and 2D are drawings of another treatment chemical and resultant protective layer on a reactor surface, respectively.
Figure 2D:
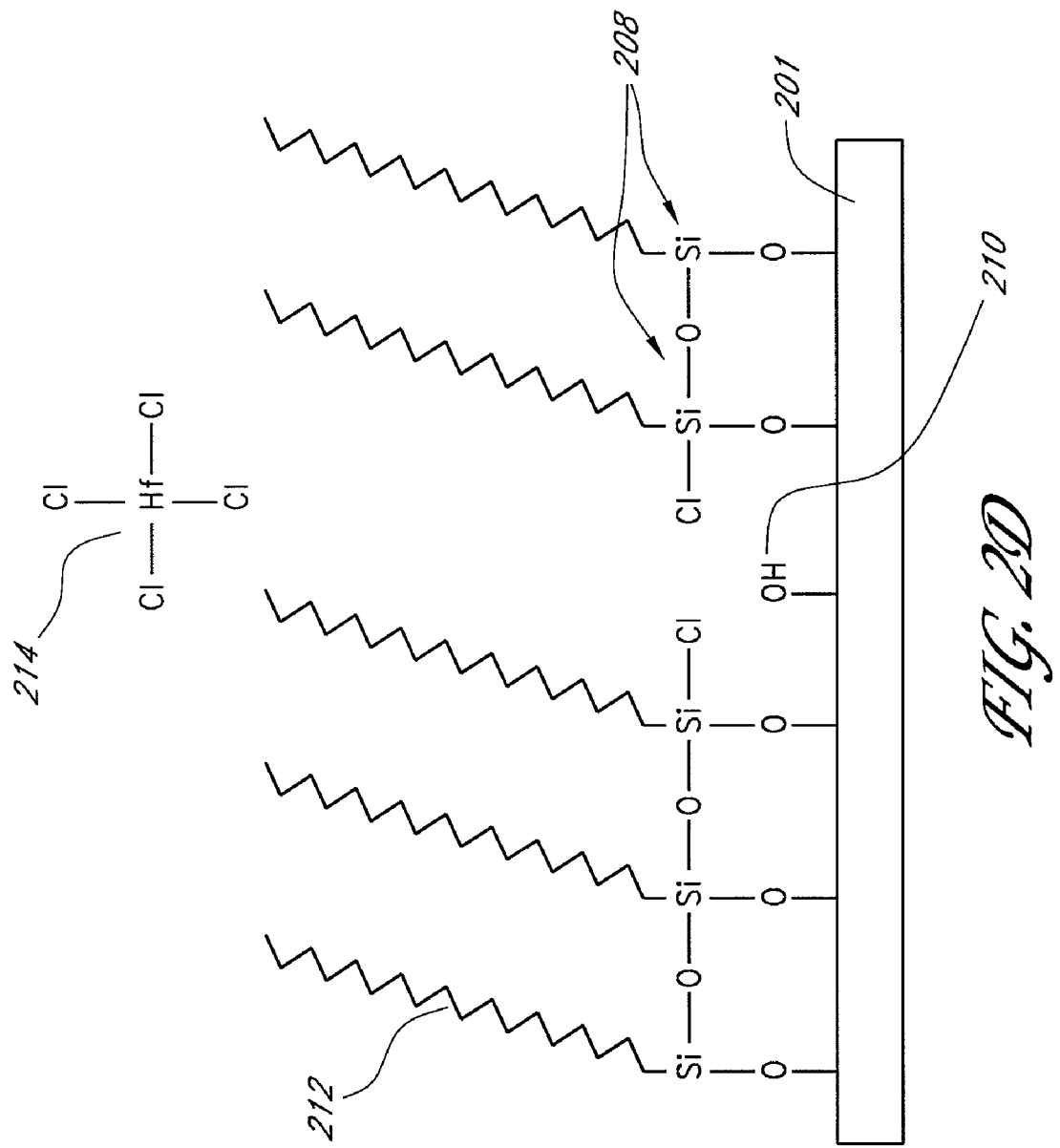

FIGS. 2C and 2D illustrate treatment with large molecules (particularly ODTCS) forming SAMs. The treatment reactant 206 shown in FIG. 2C comprises ODTCS. Typically, the reaction space surfaces 201 are exposed to a liquid solution of ODTCS, and the resultant protective layer 208 includes large organic ligands or "tails" 212. The bulk provided by these tails 212 protects any remaining reactive sites 210 not occupied under the protective layer 208, thus blocking access by any deposition reactants 214 and preventing deposition. Furthermore, the size of the tails and relative hydrophobicity encourages spontaneous and stable unidirectional organization of the molecules into SAMs. The large molecular weight also tends to correspond to more thermally stable protective films 208.

After the treatment reactant 206 has chemically reacted with the surface 201 to form the protective layer 208, the reactor is assembled (if necessary in the case of ex-situ treatment) and a substrate(s) is loaded into the deposition chamber 200. Once loaded, processing of the wafer or substrate commences and now will be described.

The order that the deposition reactant gases are cycled through the ALD reactor 100 depends on the desired product. To minimize any interaction between one or more reactant gases prior to each gas entering the deposition chamber 200, a purge gas is preferably periodically cycled through the ALD reactor 100 between pulses of the reactant gases. In this way, the inert gases can purge the reaction space of excess reactant gas and any by-product. Various reactant gases and purge gases are systematically cycled through the ALD reactor 100 to form one or more monolayers on the wafer. Other techniques known in the art can be used instead of, or in addition, to purging the deposition chamber 200, to remove the reactant gases from the deposition chamber 200. For example, the first reactant gas can be pumped out of the deposition chamber 200 before introducing the second reactant gas.

The deposition reactant gases adsorb or react on the surface of the substrate. Since a protective layer illustrated in FIG. 2B was previously formed on the surface 201, the reactant gas preferentially adsorbs or reacts on the substrate, rather than reacting with or adhering to the surfaces of the reaction space. Excess reactant gas and any by-products of the reaction exits the deposition chamber 200 via the exhaust line 120, either during a reactant pulse or during the subsequent reactant removal step. Note that adherence of reactants to the exhaust line surfaces can also be minimized by the treatments described herein.

Figure 3:
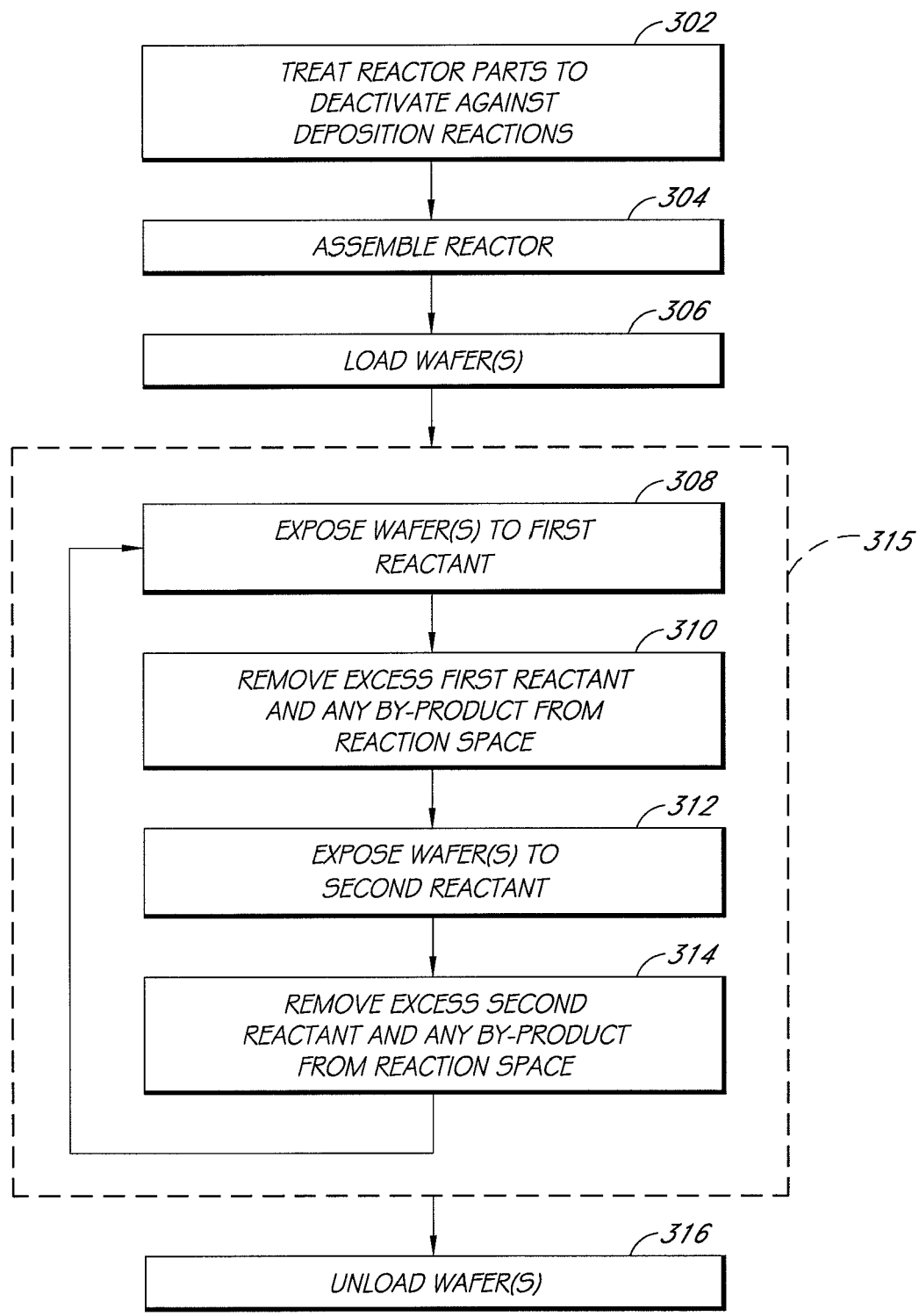
FIG. 3 is a flow chart for an ex situ treatment process that deactivates surfaces of the reaction space, followed by deposition processes.

FIG. 3 is a flow chart for a process that includes an ex situ treatment process that applies the protective layer to the surface of the reaction space. The following process can be applied to a CVD or ALD reactor. The process begins by treating 302 one or more portions of one or more reactor parts prior to assembly of the reactor. The treatment 302 is preferably applied to the portions of the reactor parts that, once assembled, at least partially define the reaction surface. For example, the protective layer can be applied to the inner surface of the top member 110 (FIG. 1) and not to the outer surface of the top member 110, since the outer surface is not exposed to the reactants. However, in some processes, it may reduce treatment process time to apply the treatment to the entire top member 110 rather than to specific surfaces or region of the top member 110. Preferably, the treatment is applied to at least the regions of the reaction space surfaces that are susceptible to reactants attaching thereto. A machine under computer or operator control can perform the application of the treatment. As used in FIG. 3, "treatment" can encompass a preparatory or pre-treatment in addition to the actual treatment that leaves a protective layer. Alternatively, the treatment is applied to the one or more reactant components by a technician. In the example given above, treatment 302 comprises dipping reactor parts into a liquid solution of ODTCS, causing self-assembled monolayers (SAMs) to form on the reactor surfaces.

Next, the reactor is assembled 304. Once assembled, the one or more portions of the reactor parts that were treated together form at least part of the reaction space. The process continues by loading 306 the wafer or substrate(s) onto the substrate support 204 in the deposition chamber 200.

Blocks 308, 310, 312, and 314 of FIG. 3 illustrate an exemplary ALD process 315. The ALD control system exposes 308 the substrates to a first reactant, which is introduced to the deposition chamber via the first reactant inlet line. Once in the deposition chamber, the first reactant adsorbs on the surface of the substrate(s). Note that, due to the prior treatment 302, the adsorption in exposure step 308 is selective to the substrate and against the treated surfaces of the reaction chamber. After the first reactant has adsorbed on the surface of the substrate, the ALD control system temporarily interrupts or impedes the flow of the first reactant to the deposition chamber. A mechanical valve or other means can be utilized by the ALD control system to impede the flow of the first reactant to the deposition chamber. For example, the ALD control system can use a ball, needle, or other mechanical valve design to preclude the first reactant from entering the deposition chamber. In addition to mechanical means, the ALD control system can create a diffusion barrier to block the first reactant from reaching the deposition chamber. In such an embodiment, an inert or inactive gas is preferentially flowed in a reverse direction through a portion of the inlet line to form the diffusion barrier within the inlet line itself.

Excess first reactant and any by-products from the reaction space are removed 310 from the deposition chamber. A purge step can be used to remove the excess first reactant and any by-products. If a purge is employed, the ALD control system flows a purge gas through the purge inlet line and into the deposition chamber. The purge gas is non-reactive and is designed to displace any portion of the first reactant that has not been sufficiently adsorbed on the surface of the substrate. This portion of the first reactant and the purge gas is exhausted from the deposition chamber via the exhaust line 120.

The process continues by exposing 312 the substrate(s) to a second reactant gas into the deposition chamber via the second reactant inlet line. Once in the deposition chamber, the second reactant gas reacts with the adsorbed species of the first reactant to form a monolayer (or partial monolayer due to steric hindrance) of a desired material on the surface of the substrate. Again, the reaction of the second reactant is selective to the substrate, relative to the treated surfaces of the reaction chamber, since little or no first reactant had adsorbed on the treated reaction spaces during the prior reactant pulse, and since the treatment that left the protective monolayer was selected to be nonreactive with a second reactant gas under the conditions for deposition. After the second reactant and adsorbed first reactant together form a first monolayer of the desired material on the surface of the substrate, the ALD control system temporarily interrupts or impedes the flow of the second reactant gas to the deposition chamber 200. A mechanical valve or other means can be utilized by the ALD control system to impede the flow of the second reactant gas to the deposition chamber 200. For example, the ALD control system can use a ball, needle, or other mechanical valve design to preclude the second reactant gas from entering the deposition chamber 200. In addition to mechanical means, the ALD control system can create a diffusion barrier to block the second reactant gas from reaching the deposition chamber 200. In such an embodiment, an inert or inactive gas is preferentially flowed in a reverse direction through a portion of the inlet line 118*b* to form the diffusion barrier within the inlet line itself.

Excess second reactant and any by-products from the reaction space are removed 314 from the deposition chamber 200. A purge step can be used to remove the excess second reactant and any by-products. If a purge is employed, the ALD control system flows a purge gas through the purge inlet line 118*c* and into the deposition chamber 200. The purge gas is non-reactive and is designed to displace any portion of the second reactant that has not reacted with the first reactant along with any by-products to the formation of the desired material on the surface of the substrate. This portion of the second reactant, any by-products, and the purge gas are exhausted from the deposition chamber 200 via the exhaust line 120.

After the first monolayer of the desired material is formed on the substrate, repeating blocks 308, 310, 312, and 314 can form a second monolayer. Once the desired number of monolayers is formed of the desired material(s) on the substrate, the control system unloads 316 the substrate or wafer from the deposition chamber 200.

Referring again to FIG. 1, a more detailed concrete example of ALD will be described. After the surface inactivation treatment, the ALD control system loads one or more substrates into the deposition chamber 200 of the ALD reactor 100. Once loading is complete, the ALD process can be initiated. An exemplary process that incorporates two reactant gases and a purge gas forms a series of monolayers of aluminum oxide ($Al_2O_3$). This exemplary ALD process utilizes trimethyl aluminum (TMA) and $H_2O$ as reactant gases. The purge gas is nitrogen ($N_2$). As explained above, more complex processes can employ three or more reactants, separated by reactant removal steps (e.g., purge pulses), along with commensurately more inlet lines 118a-n, depending on the desired monolayer to be formed on the substrate.

This exemplary ALD process begins with setting the substrate temperature above the condensation temperature but below the thermal decomposition temperature of the reactants. The first reactant pulse can start with the TMA being introduced into the deposition chamber 200 via inlet line 118a. Once in the deposition chamber 200, the TMA chemically adsorbs on the surface of the substrate, typically leaving no more than a monolayer. After the TMA has adsorbed on the surface of the substrate, the ALD control system temporarily interrupts or impedes the flow of the TMA to the deposition chamber 200. A mechanical valve or other means can be utilized by the ALD control system to impede the flow of the TMA to the deposition chamber 200. For example, the ALD control system can use a ball, needle, or other mechanical valve design to preclude the TMA from entering the deposition chamber 200. In addition to mechanical means, the ALD control system can create insert gas diffusion barrier to block the TMA from reaching the deposition chamber 200 employing a version of inert gas valving. See T. Suntola, *Handbook of Crystal Growth III, Thin Films and Epitaxy, Part B: Growth Mechanisms and Dynamics*, ch. 14, *Atomic Layer Epitaxy*, edited by D. T. J. Hurle, Elsevier Science V.B. (1994), pp. 601-663, the disclosure of which is incorporated herein by reference. See especially, pp. 624-626. In such an embodiment, an inert or inactive gas is preferentially flowed in a reverse direction through a portion of the first reactant inlet line 118a to form the diffusion barrier within the intake line itself.

After the ALD control system has interrupted or impeded the TMA from reaching the deposition chamber 200, excess reactant and any by-product is removed from the deposition chamber 200. The ALD control system 150 flows the purge gas through the purge inlet line 118c and into the deposition chamber 200. The $N_2$ gas is non-reactive and is designed to displace any portion of the TMA that has not sufficiently been adsorbed on the surface of the substrate. This portion of the TMA, any by-product and the $N_2$ is exhausted from the deposition chamber 200 via the exhaust line 120.

Once the deposition chamber 200 is purged, the ALD control system introduces the second reactant pulses, here vapor phase $H_2O$, into the deposition chamber 200 via the second reactant inlet line 118b. Once in the deposition chamber 200, the $H_2O$ chemically reacts with the adsorbed TMA to form a monolayer of aluminum oxide ($Al_2O_3$) on the surface of the substrate. After the $H_2O$ and adsorbed TMA together form $Al_2O_3$ on the surface of the substrate, the ALD control system temporarily interrupts or impedes the flow of the $H_2O$ to the deposition chamber 200. A mechanical valve or other means can be utilized by the ALD control system 150 to impede the flow of the $H_2O$ to the deposition chamber 200. For example, the ALD control system 150 can use a ball, needle, or other mechanical valve design to preclude the $H_2O$ from entering the deposition chamber 200. In addition to mechanical means, the ALD control system can employ inert gas valving. The ALD control system 150 can employ different means by which the system impedes the TMA and $H_2O$ from reaching the deposition chamber 200.

After the ALD control system 150 has interrupted or impeded the $H_2O$ from reaching the deposition chamber 200, any excess reactant and by-product is removed from the deposition chamber 200. The ALD control system flows the $N_2$ gas through the purge inlet line 118c and into the deposition chamber 200. The $N_2$ gas is non-reactive and is designed to displace any portion of the $H_2O$ that has not reacted with the TMA along with any by-products from the formation of the $Al_2O_3$ on the surface of the substrate. This portion of the $H_2O$, any by-products and the $N_2$ is exhausted from the deposition chamber 200 via the exhaust line 120. After the first monolayer of $Al_2O_3$ is formed on the substrate, a second layer can be formed. As will be described, the ALD control system 150 utilizes similar steps for forming the second monolayer as used during the formation of the first monolayer.

To form the second monolayer, the TMA is re-introduced into the deposition chamber 200 via the first reactant inlet line 118a. Once in the deposition chamber 200, the TMA chemically adsorbs on the surface of the first monolayer. After the TMA has adsorbed on the surface of the first monolayer, the ALD control system temporarily interrupts or impedes the flow of the TMA to the deposition chamber 200. The ALD control system 150 flows the $N_2$ purge gas through the purge gas inlet line 118c and into the deposition chamber 200. Once the deposition chamber 200 is purged, the ALD control system introduces the second reactant, here $H_2O$, into the deposition chamber 200 via the second reactant inlet line 118b. Once in the deposition chamber 200, the $H_2O$ chemically reacts with the adsorbed TMA to form a second monolayer of aluminum oxide ($Al_2O_3$) on the surface of the first monolayer. After the $H_2O$ and adsorbed TMA together form $Al_2O_3$ on the surface of the first monolayer, the ALD control system 150 temporarily interrupts or impedes the flow of the $H_2O$ to the deposition chamber 200 and the deposition chamber 200 is purged.

Once the second monolayer has been formed on the substrate, the ALD control system 150 can repeat the above described cycle a third time by re-introducing the TMA and $H_2O$ into the deposition chamber 200 separated by purge steps until the desired film thickness is achieved. As noted above, less than a monolayer typically forms per cycle. This is due to the fact that not all theoretically available reaction sites are actually available for reaction during the process. Typically, the ligands that facilitate self-limiting or saturative reactions (e.g., methyl groups from TMA or chlorine groups from $TiCl_4$) occupy physical space through steric hindrance. Accordingly, the average growth rate may be far less than a full molecular monolayer of the desired material per cycle. For example, ALD of $Al_2O_3$ from TMA (($CH_3)_3Al$) and $H_2O$ is typically about 1 Å/cycle, or about three to four cycles per monolayer ($Al_2O_3$ has a bulk lattice parameter of about 3 Å). The methyl terminations left by each TMA pulse reduce the number of available chemisorption sites, such that less than a full monolayer forms with each pulse.

Another exemplary monolayer that can form on a substrate using ALD is TiN. One process to form TiN is similar to the process described above for forming aluminum oxide except that the first reactant gas is $TiCl_4$ and the second reactant gas is $NH_3$.

In addition, ALD processes sequentially flow more than two reactant gases through the ALD reactor 100 to form different monolayers of film on the substrate or wafer. Each reactant gas is subsequently exhausted via the exhaust line 120 after adsorbing or reacting in the deposition chamber 200. Three or more reactants can be employed in identical serial cycles, or different pulses can be employed in different cycles to tailor the composition of the deposited material.

For example, after the first, second, or subsequent monolayer is formed on the wafer or substrate, the ALD control system can introduce a third reactant gas into the deposition chamber 200. This third reactant gas can be a different gas than the first two gases used to form the previous monolayer in the deposition chamber 200. This third reactant gas can either adsorb on or otherwise react with the surface of the previously formed monolayer. Once flow of the third reactant gas is impeded from reaching the deposition chamber 200, a purge step, similar to the previously described purge steps performed after the introduction of the first and second reactants into the deposition chamber 200, occurs. However, the purge gases for any of the processes described herein are not limited to the $N_2$ purge gas described above. Other inert or inactive gases could be used alone or in combination with the $N_2$ purge to exhaust any excess reactant gas and by-product from the deposition chamber 200. Purging of the third reactant gas can be followed by the re-introduction of the first or second reactant gases or a different fourth reactant gas, depending on the desired chemical composition of the monolayer.

Additionally, nanolaminates and mixed films can be grown with such ALD systems. Nanolaminates are films that have multiple layers of different films (for example, 5 cycles of TMA and $H_2O$ to form 5 Å $Al_2O_3$ followed by 20 cycles of hafnium chloride and water to form 10 Å $HfO_2$, repeated). Mixed ALD films are preferably amorphous films deposited by pulsing, for example, TMA, $H_2O$, $HfCl_4$, $H_2O$ in sequence.

Figure 4:
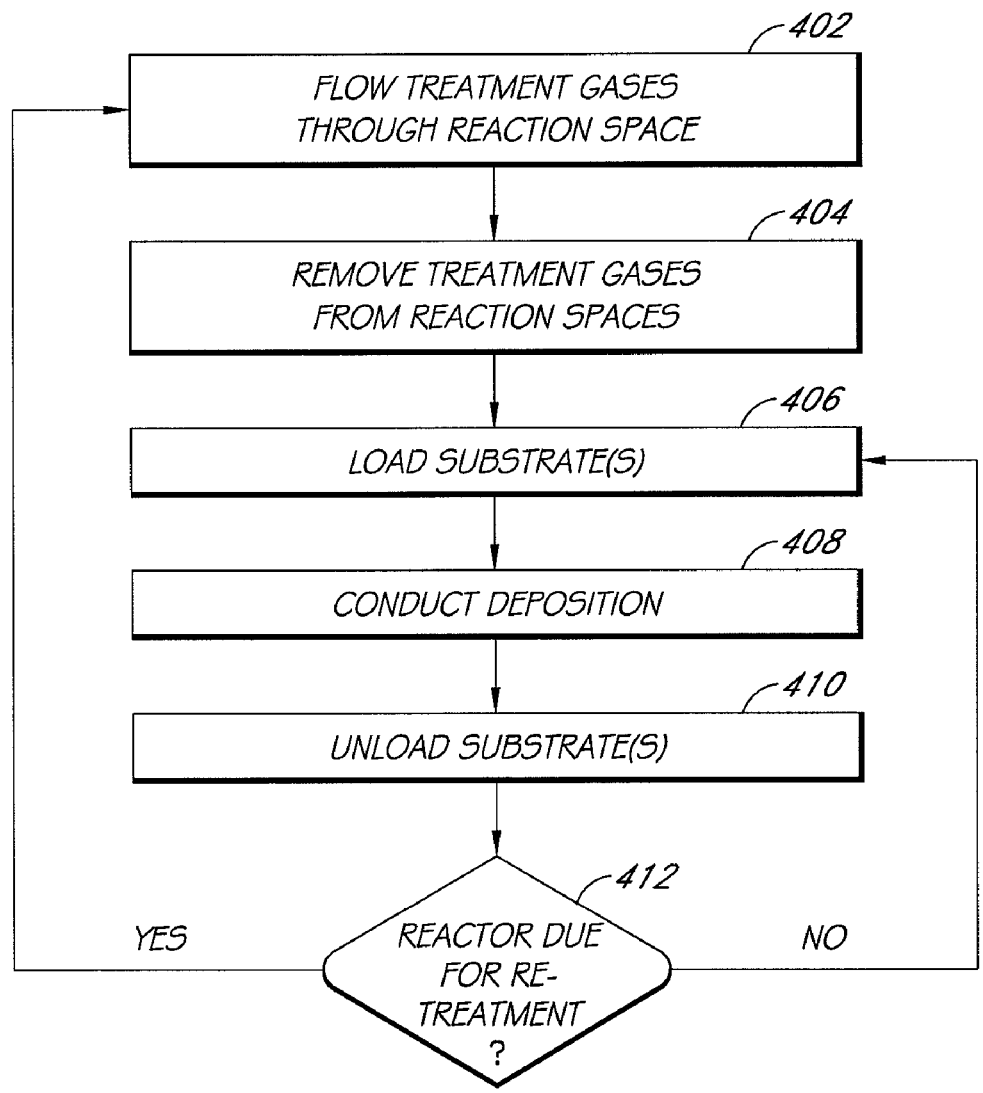
FIG. 4 is a flow chart for an in situ treatment process that deactivates surfaces of the reaction space, followed by deposition processes.

FIG. 4 is a flow chart for an in situ treatment process that deactivates surface(s) of the reaction space after the ALD reactor 100 is assembled. The illustrated process can be applied in conjunction with the process of FIG. 3, such as for re-treatment of ex situ treated reactor parts.

The process begins with the gas distribution system flowing 402 one or more treatment gases to the deposition chamber. The gas distribution system can flow each treatment gas to the deposition chamber via the shared inlet line for ALD processing. For example, depending on which treatment gas is selected, a single treatment gas, in combination with any pre-existing chemicals found on the surfaces of the deposition chamber, can desirably adhere to those surfaces at reaction sites to form a barrier in the form of a protective layer to reactant gases adhering to those same surfaces. The protective layer passivates or deactivates the surface of the deposition chamber to reduce the likelihood that undesirable deposits will form on the treated surfaces during processing of the wafer or substrate. Thus, by forming a layer of the protective coating that bonds or occupies these reaction or adsorption sites on the reaction space surface(s), these same reaction or adsorption sites become unavailable to the reactant gases. Advantageously, in comparison to purging an untreated reaction space, the cycle time for purging a treated deposition chamber is reduced since the reactant gases are less likely to adhere to the surfaces of the treated reaction space.

Treatment 402 as used in FIG. 4 can encompass use of a pre-treatment on second treatment gas. This second treatment gas could be introduced into the deposition chamber before or in combination with the first treatment gas described above. In an embodiment of the invention, this pre-treatment gas is an oxygen-containing gas. The oxygen-containing gas is introduced into the reaction chamber prior to introducing the first treatment gas. The oxygen-containing gas advantageously prepares the surfaces of the reaction space, including the deposition chamber by forming chemical bonds with the pre-existing chemicals on those surfaces of the deposition chamber. Once the oxygen-containing gas forms these chemical bonds, the surfaces of the deposition chamber are more susceptible to the first treatment gas forming a more densely packed passivation against reactant gases adhering on those same surfaces.

Excess treatment gas(es) and any by-products from the reaction space are removed 404 from the reaction space. A purge step can be used for this removal process. If a purge step is employed, the ALD control system flows a purge gas through the purge inlet line and into the deposition chamber. The purge gas is non-reactive and is designed to displace any excess portion of the treatment gas(es). This excess portion of the treatment gas(es) and purge gas is exhausted from the deposition chamber via the exhaust line. As noted above, it may be desirable to cycle between treatment 402 and purging 404 to maximize occupation of reactive sites on the reaction space surfaces.

The process continues to loading 406 substrate(s) onto the substrate support in the deposition chamber. Next, deposition 408 is performed. The deposition 408 process can be the same process as previously described with reference to steps 308, 310, 312, and 314 of FIG. 3, although the deposition following either in situ or ex situ treatment can alternatively be a form of CVD. Deposition 408 is preferably selective on the substrate, relative to treated reaction space surfaces. Once the desired thickness is formed of the desired material(s) on the substrate, the substrate(s) or wafer(s) is (are) removed 310 from the deposition chamber.

A determination 412 is made whether the reactor is due for a re-treatment or periodic treatment. For example, a re-treatment or periodic treatment could be performed after the ALD reactor has processed a selected number of wafers or after a selected period of time has elapsed. This period of time could be based on the number of operational hours for the ALD reactor or elapsed calendar time. The treatment or re-treatment of the deposition chamber and other reaction space surfaces can be performed in response to a direct or indirect inspection of the ALD reactor. For example, the direct inspection could be a visual inspection of the surfaces of the deposition chamber for undesirable deposits. Rather than, or in addition to, inspecting the surfaces of the reaction space, the processed wafer and/or exhaust gases could be examined for contamination caused by the delamination of undesirable deposits from the reaction space surfaces.

If the reactor is due for a re-treatment, the process returns to the treatment 402 as described above where the treatment gas is flowed through the reaction space. The re-treatments maintain the effectiveness of the initial treatment during use of the ALD reactor 100. Similarly, the ex situ treatment process of FIG. 3 can be repeated periodically by disassembly, treatment and re-assembly of the reactor.

Returning to decision block 412, if the reactor is not due for a re-treatment, the process returns to load 406 one or more substrates into the deposition chamber 200. The process then moves to the deposition 408 process as described above.

Figure 5:
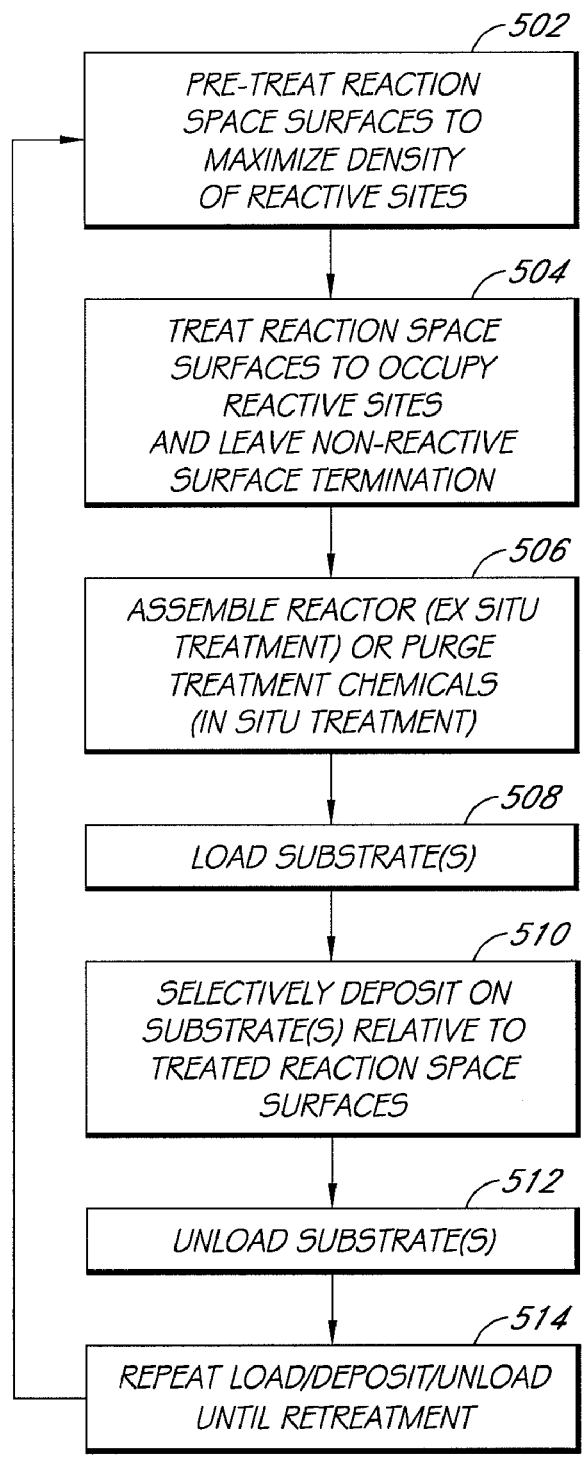
FIG. 5 is a flow chart generalized to show deactivation treatment and re-treatment, including optional pre-treatment, of reactor parts in relation to deposition runs.

FIG. 5 illustrates a process flow that is more generalized than FIGS. 3 and 4. As illustrated, reaction space surfaces are optionally pre-treated 502 to maximize the density of the reactive sites on the reaction space surfaces. Such pre-treatment 502 can be performed in situ or ex situ as described above. Note that the pre-treatment 502 is optional and can be omitted in the event sufficient reactive sites are naturally present on the reaction space surfaces.

Following any pre-treatment 502, the reaction space surfaces are treated 504 to passivate against future reactions. In the illustrated embodiments, the treatment chemical occupies reactive sites and leave a relatively non-reactive surface termination. "Non-reactive" is relative to the chemistry, temperature, and other conditions during the subsequent deposition reactions.

Following treatment 504, the reactor is prepared 506 for subsequent processing. If treatment is conducted ex situ, preparation 506 of the reactor may involve some assembly of the reactor parts that had been treated ex situ. On the other hand, if treatment is conducted in situ in accordance with the embodiment of FIG. 4, preparation 506 may entail purging treatment chemicals from the reaction space.

Following preparation 506, a deposition run 508 is conducted upon a series of substrates. Initially, one or more substrate(s) is loaded 510 into the reaction space. Selective deposition 512 is then conducted on the substrate(s). "Selective deposition" is a term well known in the art and typically refers to a process in which one surface preferably receives greater than 5 times the deposition rate that another surface receives, preferably greater than 10 times. Thus, the skilled artisan will readily appreciate that, although the treatment 504 leaves a surface termination that is "non-reactive" to the deposition chemistry, some deposition is likely to take place even on such treated reaction space surfaces. Nevertheless, considerable advantages are obtained by the deactivation treatment 504 in reducing deposition on reactor parts and also enabling reduced purging while still avoiding undesirable reactions between mutually reactive chemicals of the deposition process. The latter advantage of reduced purge time is particularly advantageous for ALD processing, wherein gas phase mixing is desirably avoided by purging reactants out of the chamber prior to reactant pulses for deposition. This enables faster processing of the substrate due to reduction in purge times.

Following selective deposition 512, substrate(s) are unloaded 514 and the process is repeated 516 for a new substrate(s). Repetition 516 continues as long as sufficient purity is obtained. Periodically, the reaction space surfaces should be re-treated, typically preceded by a cleaning process (not shown) to remove any deposits, possibly an additional passivation step (e.g., application of aluminum oxide over a metal surface), followed by optional pre-treatment 502 and treatment 504. Advantageously, the treatments 504 described herein enable a prolonged deposition run (i.e., a greater number of repetitions 516) prior to necessitating reactor cleaning, relative to proceeding without treatment. Alternatively, where the reactor is operated in a manner by which an in situ etch cycle is employed to clean reactor surfaces periodically, less frequent, shorter, or less harsh cleaning cycles are enabled by the fact that the treatment 504 allows selective deposition 512 on the substrates relative to treated reaction space surfaces.

While the above detailed description has shown, described, and pointed out novel features of the invention as applied to various embodiments, it will be understood that various omissions, substitutions, and changes in the form and details of the reactor or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An atomic layer deposition apparatus, comprising:
   a plurality of reaction space surfaces defining a reaction space;
   a substrate support structure housed within the reaction space;
   a plurality of feed lines connecting the reaction space to sources of vapor phase reactants suitable for a vapor deposition process,
   wherein at least some of the reactant space surfaces comprise a surface modification deactivating the at least some surfaces against the vapor deposition process, the surface modification comprising a protective self-assembled monolayer (SAM) layer that comprises adsorbed organic reactant molecules, wherein one end of each reactant molecule is adsorbed onto a hydrophilic surface whereas the other end of each reactant molecule is hydrophobic; and
   a control system programmed to operate said reaction space at temperatures in excess of approximately 200° C., the control system configured to provide alternated and repeated pulses of the vapor phase reactants to the reaction space in accordance with an atomic layer deposition sequence.

2. The apparatus of claim 1, wherein the protective layer comprises an adsorbed treatment chemical having a thickness of no more than about two monolayers.

3. The apparatus of claim 1, wherein the protective layer defines a hydrophobic outer surface.

4. The apparatus of claim 1, wherein the surface modification renders the vapor deposition process selective to a semiconductor substrate relative to the at least some surfaces.

5. The apparatus of claim 1, further comprising an inlet leading from a source of a treatment reactant to the reaction space, the treatment reactant providing the surface modification to the at least some surfaces.

6. The apparatus of claim 5, wherein the treatment reactant is an alkyldisilazane.

7. The apparatus of claim 5, wherein the treatment reactant is an alkylhalosilane.

8. The apparatus of claim 5, wherein the treatment reactant is an aryldisilazane.

9. The apparatus of claim 5, wherein the treatment reactant is an arylhalosilane.

10. The apparatus of claim 5, further comprising an inlet leading from a source of a pre-treatment reactant to the reaction space, the pre-treatment reactant rendering the at least some surfaces more reactive to the treatment reactant.

11. The apparatus of claim 10, wherein the pre-treatment reactant comprises an oxygen-containing reactant.

12. The apparatus of claim 1, further comprising separate inlets to the reaction space for the sources of the vapor phase reactants.

13. The apparatus of claim 1, wherein a portion of the reactant molecule comprises an alkyl group with 1 to 20 carbon atoms.

14. The apparatus of claim 1, wherein a portion of the reactant molecule comprises an aryl group with 6 to 10 carbon atoms.

15. A treated component of an atomic layer deposition (ALD) reactor that forms a portion of a reaction surface, the component comprising a portion of a surface having a protective self-assembled monolayer (SAM) layer thereon, the protective layer comprising an adsorbed treatment chemical having a thickness of less than about 5 molecular monolayers, the protective layer configured to inhibit reaction with ALD deposition reactants and comprising adsorbed organic reactant molecules, wherein one end of each reactant molecule is adsorbed onto a hydrophilic surface whereas the other end of each reactant molecule is hydrophobic, the component elevated to a temperature in excess of approximately 200° C.

16. The apparatus of claim 15, wherein a portion of the reactant molecule comprises an alkyl group with 1 to 20 carbon atoms.

17. The apparatus of claim 15, wherein a portion of the reactant molecule comprises an aryl group with 6 to 10 carbon atoms.

18. An atomic layer deposition apparatus, comprising:
a plurality of reaction space surfaces defining a reaction space;
a substrate support structure housed within the reaction space;
a plurality of feed lines connecting the reaction space to sources of vapor phase reactants suitable for a vapor deposition process,
wherein at least some of the reactant space surfaces comprise a surface modification deactivating the at least some surfaces against the vapor deposition process, the surface modification comprising a protective self-assembled monolayer (SAM) layer that comprises adsorbed organic reactant molecules, wherein one end of each reactant molecule is adsorbed onto a hydrophilic surface whereas the other end of each reactant molecule is hydrophobic; and
a control system programmed for atomic layer deposition by alternated and repeated pulses of the vapor phase reactants.

19. The apparatus of claim 18, further comprising separate inlets to the reaction space for the sources of the vapor phase reactants.

20. The apparatus of claim 18, wherein a portion of the reactant molecule comprises an alkyl group with 1 to 20 carbon atoms.

21. The apparatus of claim 18, wherein a portion of the reactant molecule comprises an aryl group with 6 to 10 carbon atoms.

* * * * *